US007037574B2

(12) United States Patent
Paranjpe et al.

(10) Patent No.: US 7,037,574 B2
(45) Date of Patent: May 2, 2006

(54) ATOMIC LAYER DEPOSITION FOR FABRICATING THIN FILMS

(75) Inventors: Ajit P. Paranjpe, Fremont, CA (US); Sanjay Gopinath, Fremont, CA (US); Thomas R. Omstead, Fremont, CA (US); Randhir S. Bubber, San Ramon, CA (US); Ming Mao, Pleasanton, CA (US)

(73) Assignee: Veeco Instruments, Inc., Woodbury, NY (US)

( * ) Notice: Subject to any disclaimer, the term of this patent is extended or adjusted under 35 U.S.C. 154(b) by 47 days.

(21) Appl. No.: 09/864,714

(22) Filed: May 23, 2001

(65) Prior Publication Data

US 2003/0003635 A1    Jan. 2, 2003

(51) Int. Cl.
*H01L 21/8242*    (2006.01)
*H01L 21/336*    (2006.01)
*C30B 23/00*    (2006.01)
*C30B 25/00*    (2006.01)

(52) U.S. Cl. ............ 428/200; 438/253; 438/254; 438/255; 438/257; 438/258; 118/102; 118/103

(58) Field of Classification Search .......... 438/200, 438/253, 254, 255, 257; 117/102, 103
See application file for complete search history.

(56) References Cited

U.S. PATENT DOCUMENTS

| 5,616,177 | A | * | 4/1997 | Yamada ............... 117/102 |
| 5,647,911 | A | | 7/1997 | Vanell et al. ........... 118/715 |
| 5,711,811 | A | | 1/1998 | Suntola et al. .......... 118/711 |
| 5,879,459 | A | | 3/1999 | Gadgil et al. .......... 118/715 |
| 5,916,365 | A | | 6/1999 | Sherman ............... 117/92 |
| 5,916,369 | A | | 6/1999 | Anderson et al. ...... 118/715 |
| 5,930,046 | A | * | 7/1999 | Solberg et al. .......... 359/580 |
| 5,944,964 | A | * | 8/1999 | Solberg et al. ........ 204/192.26 |
| 6,015,590 | A | | 1/2000 | Suntola et al. ........ 427/255.23 |
| 6,144,060 | A | * | 11/2000 | Park et al. ............. 257/310 |
| 6,174,377 | B1 | | 1/2001 | Doering et al. ......... 118/729 |
| 6,200,866 | B1 | * | 3/2001 | Ma et al. ............... 438/299 |
| 6,200,893 | B1 | | 3/2001 | Sneh .................... 438/685 |
| 6,319,439 | B1 | * | 11/2001 | Lee et al. ............... 264/81 |
| 6,335,240 | B1 | * | 1/2002 | Kim et al. ............. 438/253 |
| 6,342,277 | B1 | | 1/2002 | Sherman ............... 427/562 |
| 6,358,632 | B1 | * | 3/2002 | Dickey et al. ......... 428/690 |
| 6,387,185 | B1 | | 5/2002 | Doering et al. ......... 118/729 |
| 6,391,785 | B1 | | 5/2002 | Satta et al. ............. 438/704 |

(Continued)

FOREIGN PATENT DOCUMENTS

JP    62221102    9/1987

(Continued)

OTHER PUBLICATIONS

International Search Report, PCT US2004037172, 11 pages, mailing date May 25, 2005.

(Continued)

*Primary Examiner*—Long Pham
*Assistant Examiner*—Shrinivas H. Rao
(74) *Attorney, Agent, or Firm*—Baker Botts L.L.P.

(57) ABSTRACT

An atomic layer deposition (ALD) process deposits thin films for microelectronic structures, such as advanced gap and tunnel junction applications, by plasma annealing at varying film thicknesses to obtain desired intrinsic film stress and breakdown film strength. The primary advantage of the ALD process is the near 100% step coverage with properties that are uniform along sidewalls. The process provides smooth ($R_a$~2 Å), pure (impurities<1 at. %), $AlO_x$ films with improved breakdown strength (9–10 MV/cm) with a commercially feasible throughput.

30 Claims, 7 Drawing Sheets

U.S. PATENT DOCUMENTS

| | | | |
|---|---|---|---|
| 6,416,577 B1 | 7/2002 | Suntoloa et al. ............... | 117/88 |
| 6,420,230 B1* | 7/2002 | Derderian et al. .......... | 438/255 |
| 6,441,417 B1* | 8/2002 | Zhang et al. ............... | 257/295 |
| 6,444,495 B1* | 9/2002 | Leung et al. ............... | 438/118 |
| 6,447,607 B1 | 9/2002 | Soininen et al. ............ | 117/200 |
| 6,448,192 B1* | 9/2002 | Kaushik ..................... | 438/785 |
| 6,451,119 B1 | 9/2002 | Sneh et al. ................. | 118/715 |
| 6,451,695 B1 | 9/2002 | Sneh ......................... | 438/685 |
| 6,464,779 B1 | 10/2002 | Powell et al. ................. | 117/89 |
| 6,475,276 B1 | 11/2002 | Elers et al. ................... | 117/84 |
| 6,475,910 B1 | 11/2002 | Sneh ......................... | 438/685 |
| 6,482,262 B1 | 11/2002 | Elers et al. ................... | 117/84 |
| 6,482,740 B1 | 11/2002 | Soininen et al. ............ | 438/686 |
| 6,503,330 B1 | 1/2003 | Sneh et al. ................. | 118/715 |
| 6,506,255 B1 | 1/2003 | Kim ......................... | 118/715 |
| 6,506,352 B1 | 1/2003 | Lindfors et al. ............ | 423/240 |
| 6,511,539 B1 | 1/2003 | Raaijmakers ............... | 117/102 |
| 6,524,952 B1 | 2/2003 | Srinivas et al. ............. | 438/649 |
| 6,539,891 B1 | 4/2003 | Lee et al. ................... | 118/723 |
| 6,540,838 B1 | 4/2003 | Sneh et al. ................. | 118/715 |
| 6,548,424 B1 | 4/2003 | Putkonen .................... | 438/785 |
| 6,551,406 B1 | 4/2003 | Kilpi ......................... | 118/728 |
| 6,562,140 B1 | 5/2003 | Bondestam et al. ........ | 118/715 |
| 6,572,705 B1 | 6/2003 | Suntola et al. ............... | 118/702 |
| 6,579,374 B1 | 6/2003 | Bondestam et al. ........ | 118/725 |
| 6,599,572 B1 | 7/2003 | Saanila et al. .......... | 427/249.18 |
| 6,602,784 B1 | 8/2003 | Sneh ......................... | 438/680 |
| 6,616,986 B1 | 9/2003 | Sherman ..................... | 427/562 |
| 6,620,723 B1 | 9/2003 | Byun et al. ................. | 438/627 |
| 6,627,268 B1 | 9/2003 | Fair et al. ................... | 427/533 |
| 6,630,030 B1 | 10/2003 | Suntola et al. ............. | 118/728 |
| 6,630,401 B1 | 10/2003 | Sneh ......................... | 438/680 |
| 6,632,279 B1 | 10/2003 | Ritala et al. ................. | 117/101 |
| 6,635,965 B1 | 10/2003 | Lee et al. ................... | 257/758 |
| 6,638,810 B1 | 10/2003 | Bakli et al. ................. | 438/240 |
| 6,638,859 B1 | 10/2003 | Sneh et al. ................. | 438/680 |
| 6,638,862 B1 | 10/2003 | Sneh ......................... | 438/685 |
| 6,652,924 B1 | 11/2003 | Sherman ..................... | 427/576 |
| 6,660,126 B1 | 12/2003 | Nguyen et al. ......... | 156/345.34 |
| 6,664,192 B1 | 12/2003 | Satta et al. ................. | 438/704 |
| 6,679,951 B1 | 1/2004 | Soininen et al. ............ | 148/240 |
| 6,689,210 B1 | 2/2004 | Soininen et al. .............. | 117/89 |
| 6,720,260 B1 | 4/2004 | Fair et al. .................... | 438/680 |
| 6,727,169 B1 | 4/2004 | Raaijmakers et al. ........ | 438/622 |
| 6,734,020 B1 | 5/2004 | Lu et al. ........................ | 436/55 |
| 6,759,081 B1 | 7/2004 | Huganen et al. ............... | 427/58 |
| 6,764,546 B1 | 7/2004 | Raaijmakers ................ | 117/93 |
| 6,767,582 B1 | 7/2004 | Elers .......................... | 427/253 |
| 6,777,353 B1 | 8/2004 | Putkonen .................... | 438/785 |
| 6,794,287 B1 | 9/2004 | Saanila et al. ............... | 438/674 |
| 6,800,173 B1 | 10/2004 | Chiang et al. .......... | 156/345.33 |
| 6,800,552 B1 | 10/2004 | Elers et al. ................. | 438/680 |
| 6,811,814 B1 | 11/2004 | Chen et al. .............. | 427/248.1 |
| 6,818,067 B1 | 11/2004 | Doering et al. ............. | 118/715 |
| 6,821,889 B1 | 11/2004 | Elers et al. ................. | 438/680 |
| 2001/0024387 A1* | 9/2001 | Raaijmakers et al. | |
| 2002/0013487 A1* | 1/2002 | Norman et al. | |
| 2002/0041931 A1 | 4/2002 | Suntola et al. .......... | 427/255.28 |
| 2002/0106846 A1 | 8/2002 | Seutter et al. .............. | 438/200 |
| 2002/0108570 A1 | 8/2002 | Lindfors ..................... | 118/715 |
| 2002/0137260 A1* | 9/2002 | Leung et al. | |
| 2002/0140103 A1* | 10/2002 | Kloster et al. .............. | 257/767 |
| 2002/0187084 A1 | 12/2002 | Lindfors et al. ............ | 422/177 |
| 2003/0003635 A1 | 1/2003 | Paranjpe et al. ............ | 438/149 |
| 2003/0096468 A1 | 5/2003 | Soininen et al. ............ | 438/200 |
| 2003/0101927 A1 | 6/2003 | Raaijmakers ............... | 117/200 |
| 2003/0116087 A1 | 6/2003 | Nguyen et al. ............. | 118/715 |
| 2003/0121469 A1 | 7/2003 | Lindfors et al. ............ | 117/105 |
| 2003/0140854 A1 | 7/2003 | Kilpi .......................... | 118/715 |
| 2003/0150385 A1 | 8/2003 | Bondestam et al. ........ | 118/722 |
| 2003/0183171 A1 | 10/2003 | Sneh et al. ................. | 118/724 |
| 2004/0005753 A1 | 1/2004 | Kostamo et al. ............ | 438/222 |
| 2004/0007171 A1 | 1/2004 | Ritala et al. ................... | 117/89 |
| 2004/0076751 A1 | 4/2004 | Sherman ................ | 427/255.34 |
| 2004/0076837 A1 | 4/2004 | Hein et al. .................. | 428/446 |
| 2004/0083949 A1 | 5/2004 | Sherman ...................... | 117/84 |
| 2004/0121616 A1 | 6/2004 | Satta et al. ................. | 438/778 |
| 2004/0130029 A1 | 7/2004 | Raajimakers et al. ....... | 257/758 |
| 2004/0161636 A1 | 8/2004 | Hujanen et al. ............ | 428/692 |
| 2004/0202786 A1 | 10/2004 | Wongsenakhum et al. .. | 427/250 |

FOREIGN PATENT DOCUMENTS

| | | |
|---|---|---|
| WO | WO 00/38191 | 6/2000 |
| WO | WO 01/88972 | 11/2001 |
| WO | WO 02/09126 | 1/2002 |
| WO | WO 02/09158 | 1/2002 |

OTHER PUBLICATIONS

Addison, C.C. et al. "The Vapour Pressure of Anhydrous Copper Nitrate, and its Molecular Weight in the Vapour State", *J. Chem. Soc.,* pp. 3099-3106, 1958.

Akerman, J.J et al., "Identifying Tunneling in Ferromagnetic-Insulator-Ferromagnetic Thin Film Structures", World-wide web, physics.ucsd.ediuksgrp/Tunneling.html, pp. 1-6, printed Feb. 4, 2002.

Bobo, J.F. et al., "Spin-dependent Tunneling Junctions with Hard Magnetic layer Pinning", *Journal of Applied Physics,* vol. 83, No. 11, pp. 6685-6687, 1998.

Daughton, J.M., World-wide web nve.com/otherbiz/mram2.pdf, "Advanced MRAM Concepts", pp. 1-6, Feb. 7, 2001.

Fereday, R.J. et al., "Anhydrous Cobalt (III) Nitrate", *Chemical Communications,* pp. 271, 1968.

Hsaio, R., "Fabrication of Magnetic Recording Heads and Dry Etching Head Materials", IBM Journal of Research and Development, vol. 43, (1/2): 1999, pp. 89-102, 1999.

Imai, Takuji, World-wide web nikkeibp.asiabiztech.com/nea/200008/tech_108675.html, "100 Gbit/Inch HDD Just Around the Corner", pp. 1-6, Aug. 2000.

Nilsen, O et al, "Thin Film Deposition of lanthanum Manganite Perovskite by the ALE Process", *Journal of Materials Chemistry,* vol. 9, pp. 1781-1784., 1999.

Pakrad, C.D., "Pure Tech: Growth of MR/GMR Head Materials," World-wide web, puretechinc.com/tech_papers/tech_papers-4.htm, pp. 1-2, 1999.

Riihela et al., "Low Temperature Deposition of AIN Films by an Alternate Syppy of Trimethyl Aluminum and Ammonia" Chemical Vapor Deposition, 2(6): pp. 277-283., 1996.

Suntola, Tuomo; *Handbook of Crystal Growth,* vol. 3, Thin Films and Epitaxy, Part B: Growth Mechanisms and Dynamics, Chapter 14, pp. 601-663, Hurle, ed. Elsevier Science B.V., 1994.

Ritala et al., "Ataomic Layer Epitaxy-a Valuable Tool for Nanotechnology?" Nanotechnology vol. 10, pp. 19-24, 1999.

Wang, Shan X., "Advanced Materials for Extremely High Density Magnetic Reocrding Heads," Department of Electrical Engineering, Stanford University, Stanford, CA 94305-4045, presentation., no date available.

World-wide web, megahaus.com/westerndigital/shitepapers/gmr_wp.shtml., "GMR Head Technology: Increased Areal Density and Improved Performance Areal Density," pp. 1-4., Feb. 2000.

World-wide web, semiconductor.net/semiconductor/issues/Issues/1998/feb98/docs/emerging.asp, "GMR Read-Write Heads Yield Data Storage Record," pp. 1-2., Feb. 1998.

World-wide web, stoner.leeds.ac.uk/research/gmr.htm, "Giant Magnetoresistance (GMR) Heads", pp. 1-6., Printed Feb. 4, 2002.

World-wide web, pcguide.com/ref/hdd/op/heads/techGMR-c.html, "Giant Magnetoresistive (GMR) Heads", pp. 1-4., Printed Dec. 18, 2004.

Utriainen, et al., "Studies of Metallic Film Growth in an Atomic Layer Epitaxy reactor Using M(acac)2(M=Ni, Cu, Pt) Precursors", Applied Surface Science, vol. 157, pp. 151-158., 2000.

Ueno et al., "Cleaning of CHF3, plasma-etched SiO2/SiN/CU via Structures Using a Hydrogen Plasma, an Oxygen Plasma and Hexafluoroacetylacetone Vapors," *J. VAc. Sci. Technology B*, vol. 16, No. 6, pp. 2986-2995., Nov./Dec. 1998.

Omstead, Thomas, et al.; "Filling High-AR Structures Using Pulsed Nucleation Layer Deposition", Solid State Technology, vol. 45, pp. 51-56., Sep. 2002.

* cited by examiner

ATOMIC LAYER DEPOSITION FOR FABRICATING THIN FILMS

TECHNICAL FIELD OF THE INVENTION

The present invention generally relates to microelectronic device fabrication, and more particularly to atomic layer deposition for fabricating thin films.

BACKGROUND OF THE INVENTION

Atomic layer deposition (ALD) has gained acceptance as a technique for depositing thin and yet continuous layers of metals and dielectrics with high conformality. In ALD, a substrate is alternatively dosed with the precursor and one or more reactant gases so that reactions are limited to the wafer surface. Thus, gas phase reactions are avoided since the precursor and the reactant gases do not mix in the gas phase. Uniform adsorption of precursors on the wafer surface during ALD produces highly conformal layers at both microscopic feature length scales and macroscopic wafer length scales, and achieves a high density of nucleation sites. These attributes result in the deposition of spatially uniform, conformal, dense and continuous thin films.

The high quality films achievable by ALD have resulted in increased interest in ALD for the deposition of conformal barriers, high-k dielectrics, gate dielectrics, tunnel dielectrics and etch stop layers for semiconductor devices. ALD films are also thermally stable and very uniform which makes them attractive for optical applications. Another potential application for ALD is the deposition of $AlO_X$ as a gap layer for thin film heads, such as heads for recording densities of 50 $Gb/in^2$ and beyond which require very thin and conformal gap layers. Conventionally sputtered gap layers are difficult to reliably scale below 300 Å due to excessive leakage currents. Although ion beam deposited gap layers can be scaled down in thickness to below 300 Å, such layers tend not to be adequately conformal. Further, process integration considerations for thin film heads of 200 Å or less tend to constrain the maximum deposition temperature to below 200° C.

Although ALD techniques support deposition of conformal thin layers, a number of difficulties exist which make commercial applications of ALD unworkable. One difficulty is that the repeated cycle of precursor and reactant adsorption and intervening chamber purges is time consuming, resulting in reduced throughput relative to conventional techniques. Another difficulty is that for a continuous monolayer of precursor to be adsorbed on the wafer without being thermally dissociated and for other process constraints, a relatively low deposition temperature is typically needed. However, the quality of the deposited thin film as measured by breakdown field strength tends to suffer at lower temperatures as impurities are incorporated in the film due to incomplete reaction of the precursor. Breakdown field strength comprises a good measure of film quality related to impurities, defects, roughness and film continuity.

SUMMARY OF THE INVENTION

Therefore a need has arisen for a method and system which improves ALD thin film quality.

A further need has arisen for a method and system which provides improved throughput for ALD thin films.

In accordance with the present invention, a method and system are provided that substantially eliminates or reduces disadvantages and problems associated with previously developed methods and systems for ALD. Periodic annealing during ALD of thin films after a predetermined film thickness or associated number of deposition cycles improves film quality. Throughput is improved by maintaining desired process parameters for precursor flow, reactant flow and purge cycles, with reduced cycle time and risk of introducing impurities accomplished with a dual zone showerhead to limit mixing of residual reactants.

More specifically, a method of fabricating a conformal thin film for integrated electronic structures is provided. ALD cycles of adsorbing and reacting a precursor on a wafer to deposit the thin film are performed with intervening anneals to control the quality of the ALD film. Process throughput and quality are enhanced by the use of a dual zone showerhead and by control of predetermined process parameters, such as precursor and reactant flow times and quantity, purge times, the number and frequency of anneals, and wafer temperature, so that contaminants are reduced and film breakdown field strength and intrinsic stress are at desired levels.

In one embodiment of the present invention, an aluminum oxide thin film is deposited with a predetermined number of ALD cycles and with one or more intervening anneals performed after a predetermined number of ALD cycles or associated number film thickness. An ALD cycle comprises distributing a precursor through a first zone of a multi-zone shower head to achieve a continuous monolayer of precursor adsorption on the wafer, and purging the processing chamber. The monolayer of precursor is oxidized with a flow of water through a second zone of the multi-zone showerhead, and the processing chamber purged to prepare for another ALD cycle. The wafer is maintained at a generally low temperature of between 60 and 350 C to aid in the adsorption of a continuous monolayer of precursor that is not thermally dissociated. Every 25–50 Å of film thickness, which at 0.8 Å per ALD cycle takes approximately 25 to 50 ALD cycles, a thermal or plasma anneal of the ALD film is performed in a reactive ambient to reduce impurity incorporation that generally results from lower wafer temperatures that leave the chemical reaction between the precursor and reaction gas incomplete. For instance, by varying the frequency of an in-situ RF plasma anneal in an $Ar/O_2$ ambient, the intrinsic film stress of the $AlO_X$ film can be varied from tensile to compressive. The use of the multi-zone showerhead, predetermined precursor and reactant pulse times, and adequate purging increases throughput and reduces the introduction of contaminants to the wafer.

According to a further aspect of the invention, a microstructure having a thin film deposited using an atomic layer deposition (ALD) is disclosed. The microstructure includes a substrate having a thin film fabricated using a low temperature atomic layer deposition wherein the thin film includes at least one plasma annealed layer.

The present invention provides a number of important technical advantages. One important technical advantage is that intrinsic stress is varied from tensile to compressive and breakdown voltage for an ALD film is enhanced by varying the number of plasma anneals performed for a predetermined number of ALD cycles. For instance, a 60–200° C. atomic layer deposition (ALD) process that provides smooth ($R_a$~2 Å), pure (impurities <1 at. %), and highly conformal (100% step coverage) $AlO_x$ films with excellent breakdown strength (9–10 MV/cm) is provided by performing a plasma anneal every 25 to 50 ALD cycles. In one form, optimal chamber configuration and precursor/oxidant delivery methods have been identified for trimethylaluminum (TMA) as an aluminum source and water as an oxidant.

Another important technical advantage is that the resulting ALD AlO$_x$ films are conformal and exhibit excellent insulating characteristics down to 5–10 Å to support thin film applications such as a gap layer for thin film heads or a tunnel barrier for magnetic tunnel junctions. Plasma annealing the films in-situ every 25–50 Å, makes the as-deposited tensile stress slightly compressive and the breakdown field to exceed 10 MV/cm. Advanced thin film heads for recording densities of 50 Gb/in$^2$ and beyond require very thin and conformal gap layers. The process uses trimethylaluminum (TMA) as the aluminum source and water as the oxidant. Although ALD provides a relatively low deposition rate, with proper chamber design, commercial production throughput requirements can be met despite a relatively low deposition rate of approximately 0.8 to 1.1 Å/cycle. A small chamber volume that allows a cycle time of 5 s meets production throughput requirements of 4–6 wph for a 100 Å film.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments and their advantages are best understood by reference to FIGS. 1 through 11, wherein like numbers are used to indicate like and corresponding parts.

The conceptual groundwork for the present invention involves a low temperature atomic layer deposition (ALD) processes to create highly conformal thin films. In one form, a substrate is hydroxylated and a precursor introduced to the substrate within a low temperature ambient resulting in an atomic layer deposition thin film of AlO$_X$ having minimal impurities and a thickness of approximately 0.8 Å per deposition cycle. During the process, one or more ALD layers are annealed to provide a slightly compressive film that enhances the film's breakdown voltage. For instance, in-situ plasma annealing in an Ar/O$_2$ ambient every 25 to 50 Å of deposition thickness enhances an AlO$_x$ thin films breakdown strength and allows fine tuning for another degree of freedom for film stress control.

One important application for AlO$_X$ thin films deposited according to the present invention is in giant magnetoresistive recording heads. For instance, film stress control in such recording heads is important for stabilizing the bias point or the operation point to ensure sufficient read sensor output amplitude. An advantage of the present invention is that additional degree of freedom for film stress control associated with varying the frequency of in-situ plasma annealing improves giant magnetoresistive recording head quality. In addition, during the recording head integration process, deposition temperature is an important factor. For instance, photoresist patterns and sensor thermal stability during the integration process generally require process temperatures of below 200 to 230° C. to prevent photoresist from flowing and atomic interdiffusion in the multilayer thin films. The present invention supports deposition of AlO$_X$ thin films in the temperature range of 60 to 200° C. with superior structure integrity, physical properties and topographic conformality.

Figure 1:
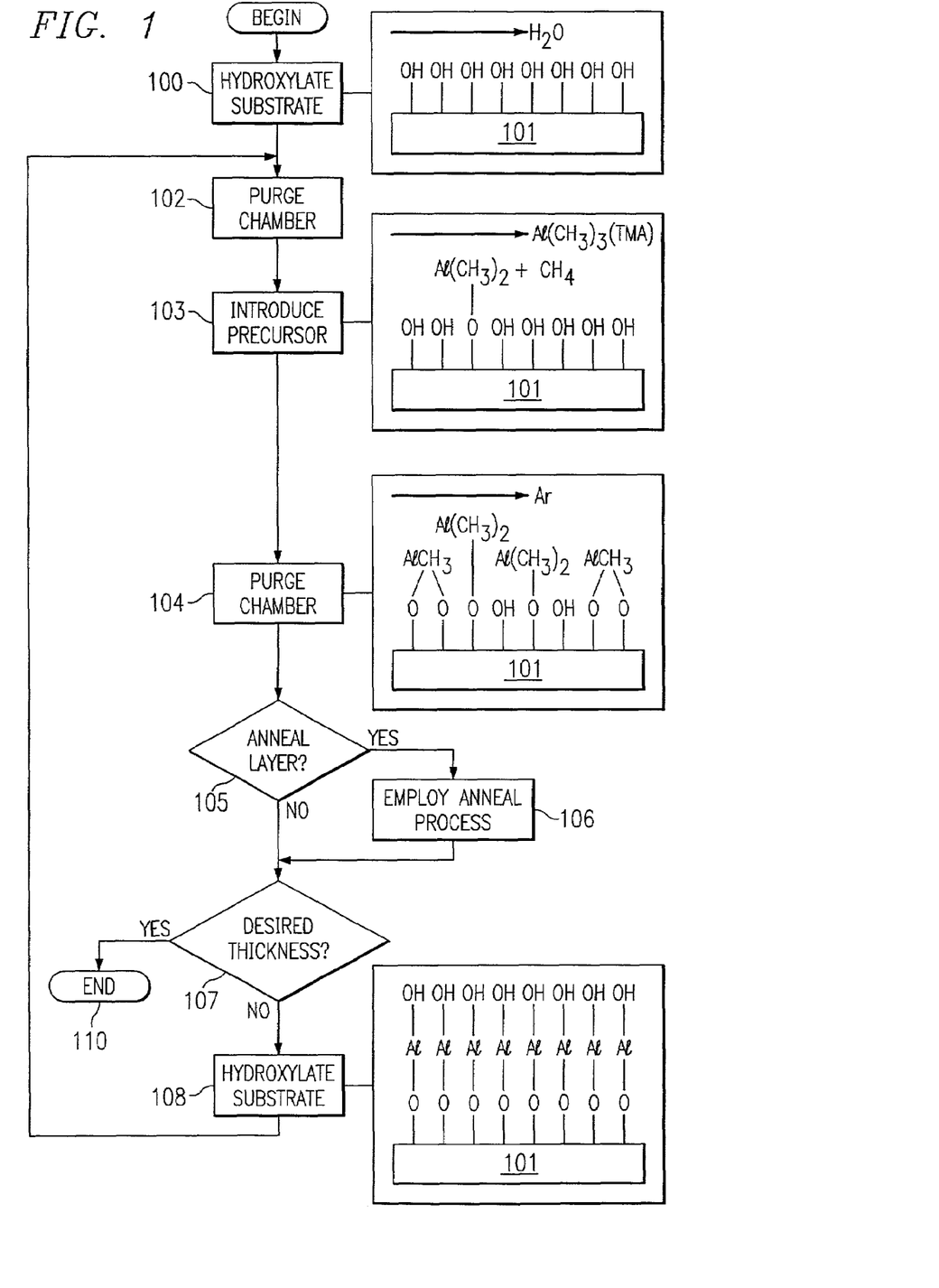
FIG. 1 illustrates a flow diagram of a low temperature ALD process for fabricating thin films according to one aspect of the invention.

FIG. 1 illustrates an ALD process based on sequentially dosing a substrate with an aluminum bearing precursor and an oxidant. In one embodiment, trimethylaluminum (TMA), a highly volatile precursor with a vapor pressure of 11 Torr at room temperature, may be used as an aluminum source. Trimethylaluminum is thermally stable at temperatures less than 350° C. ensuring that the precursor remains intact when chemisorbed on substrate 101 until it reacts with an oxidant. Trimethylaluminum is a pyrophoric liquid at room temperature and is diluted to a 10% weight in octane or similarly effective dilutions tom make the trimethylaluminum less pyrophoric. In other embodiments, precursors such as tri-isobutylaluminum (TIBA) and dimethylaluminum hydride (DMAH), although sufficiently volatile, may be used giving regard to thermal decomposition at temperatures as low as 200° C. Halogenated precursors such as AlCl$_3$ may also be used, but require higher deposition temperatures (~500° C.), which may also result in ~0.5% chlorine incorporation. Organometallic precursors may incorporate trace amounts of carbon and hydrogen but these are usually benign and may not deteriorate film properties. Other embodiments may include using oxygen bearing aluminum precursors, but these are generally hydrophobic and may not readily chemisorb on hydroxylated (i.e. OH containing) surfaces.

The process illustrated in FIG. 1 begins at step 100 with a surface hydroxylation of substrate 101 using water as an oxidant resulting in OH groups chemisorbed on the surface of substrate 101 heated to a temperature of approximately 150° C.–200° C., although a temperature range of between 60° C.–350° C. will prove operable. Surface hydroxylation helps to drive the chemisorption of subsequent TMA molecules, although adsorption of TMA may be performed followed by surface hydroxylation. Upon hydroxylating the surface of substrate 101, a chamber housing substrate 101 may be purged 102 and subsequently a precursor, such as TMA, may be introduced 103 into the chamber and chemisorbed to the hydroxylated surface of substrate 101. The method then proceeds to step 104 where an inert gas is introduced to the chamber to purge the remaining precursor from the chamber. Upon purging the chamber the method proceeds to step 105 where the method determines if substrate 101 having an ALD layer should be annealed 105. If substrate 101 should be annealed the method proceeds to step 106 to anneal substrate 101 and to step 107 to determine if a desired thickness has been achieved. The method then repeats until a desired film thickness is achieved or to step 105 where the method ends. As a result, a substantially continuous monolayer of precursor deposits a thin film on the surface of substrate 101.

Through chemisorption, the process ensures that the precursor is not desorbed from substrate 101 during purge step 104 thereby reducing precursor concentration in the gas phase to trace levels before introduction of an oxidant. Alternate embodiments may include using a variety of oxidants (e.g. $H_2O_2$, $O_2$, $O_3$, $N_2O$, etc.), however $H_2O$ appears to be well-suited for the aforementioned reasons. Additionally, a different reagent gas (e.g. $NH_3$) may be used for ALD AlN and ALD $AlO_xN_y$. For example, crystalline AlN films can be deposited at 300° C.–400° C. and 25–50 Torr using alternating pulses of DMEAA and $NH_3$.

In another embodiment, a process cycle for FIG. 1 may include depositing an ALD layer using heating of substrate 101 at a desired temperature (e.g., 200–350° C.) in an inert ambient at a process pressure. Substrate 101 may then be dosed with oxidant ($H_2O$) to hydroxylate the surface of substrate 101. The oxidant may be transported using a carrier gas. The process chamber may then be purged with a high flow of inert gas to reduce water concentration in the delivery line, showerhead and chamber to trace levels. Substrate 101 may then be dosed 103 with a short pulse (0.5 s–2 s) of precursor to adsorb a continuous monolayer of precursor on the surface of substrate 101. The precursor may be transported to substrate 101 by a carrier gas while maintaining chamber pressure at its set-point value. The chamber may then be purged 104 with a high flow of inert gas to reduce precursor concentration in the delivery line, showerhead and chamber to trace levels. The process may then be repeated multiple times to obtain a desired film thickness. For example, each cycle may deposit ~0.8 Å of AlO on substrate 101.

The method of FIG. 1 advantageously provides a continuous monolayer of precursor adsorbed on substrate 101 that is not thermally dissociated using a low deposition temperature. At lower temperatures, a chemical maintained reaction between precursor and reacting gas may not go to completion resulting in impurity incorporation. In one form, impurity incorporation may be reduced by annealing one or more layers in a reactive ambient every 25–50 Å of deposition. Annealing 106 may include either a thermal (RTP) anneal or a plasma anneal and may be used periodically to reduce film stress of the resulting ALD layers. RTP cycle utilizes a lamp and elevated temperatures and may not be desired for all embodiments. A lower relative processing temperature may be achieved by employing an in-situ plasma anneal in an $Ar/O_2$ ambient to ensure complete oxidation and controlling film stress. As such, the method of FIG. 1 may incorporate an optional in-situ plasma annealing step in an $Ar/O_2$ ambient periodically (e.g. every 25–50 Å or approximately every 25–50 ALD cycles) at the termination of an ALD cycle. By altering the frequency of anneals, intrinsic film stress can be varied from tensile to compressive and breakdown voltage can be enhanced.

Figure 2:
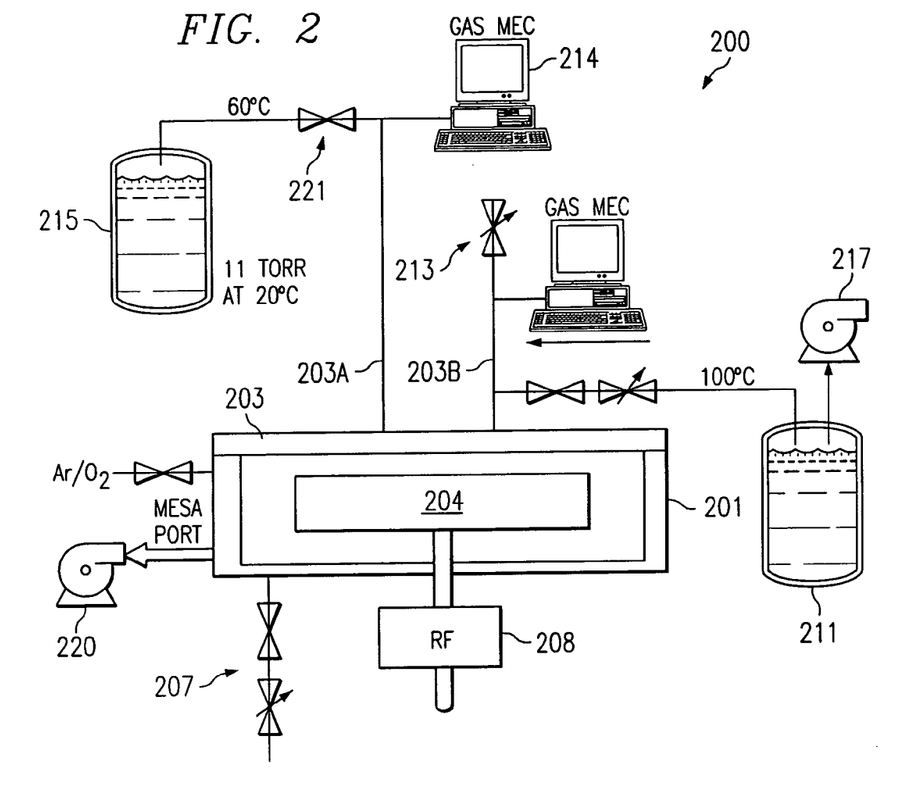
FIG. 2 illustrates a system operable to employ a low temperature ALD process for fabricating thin films according to one embodiment of the invention.

FIG. 2 illustrates a system operable to employ a low temperature ALD process for fabricating thin films according to one embodiment of the invention. A process system, illustrated generally at 200, may be optimized for an ALD process according to teachings of the invention and may include a Veeco Nexus 800 cluster tool equipped with a module for sputter etch, and a CVD module optimized for ALD and configured to process 200 mm substrates. System 200 includes a warm-wall stainless steel chamber 201 with wall temperature regulated at approximately 70° C. Reactants may be introduced through a multi-zone showerhead 203 maintained at approximately 100° C. A two-zone resistively heated chuck 204 with a backside Ar gas flow 207 and substrate clamping ensures good thermal contact and uniform wafer temperature. A turbo molecular pump 220 may be used to achieve good base pressure while a dry pump may be used to pump the process gases during the process. Chamber 201 may be pumped down to $10^{-6}$ Torr prior to deposition using turbo molecular pump 220.

A trimethylaluminum source 215 with a vapor pressure of 11 Torr at room temperature may be used as a precursor source. High vapor pressure provides sufficient pressure differential to achieve a high flow of TMA into chamber 201 that is in the Torr range. An Ar carrier gas 214 sweeps the precursor into the chamber through first showerhead zone 203A. During the TMA purge step, the TMA flow is shut off and the Ar flow is increased substantially to purge chamber 201 through first showerhead zone 203A. Ar 217 may be bubbled through a room temperature water bubbler 211 at regulated pressure to transport water into the chamber through second showerhead zone 203B. Additional diluent Ar 213 may be fed into second showerhead zone 203B. At the conclusion of the water flow step, a high Ar flow through second showerhead zone 203B purges chamber 201. The use of a dual showerhead limits mixing of residual reactants which could otherwise introduce impurities to the chamber. An Ar purge 207 introduced through the base of chamber 201 acts as a ballast gas load to help regulate chamber pressure. The substrate is clamped to heated chuck 204 with backside Ar to enhance heat transfer. Chuck 204 is RF biased 208 for a plasma anneal cycle as desired, such as every 25 to 50 TMA/$H_2O$ ALD cycle. An $Ar/O_2$ mixture 205 is fed through the MESA valve port 207 during the plasma anneal step.

Several constraints apply to flow rates and durations for each of step in an ALD sequence and should be considered to achieve the desired film quality. Each step should be substantially short to decrease the duration of each cycle and enhance the effective deposition rate. For example, with a deposition rate of 0.8 Å/cycle and a cycle duration of 20 s, the effective deposition rate is ~2.5 Å/min. Reducing the duration of the cycle to 5 s increases the effective deposition rate to ~10 Å/min. Since typical film thickness for some gap applications is 150 Å, the substrate throughput may be significantly affected by the effective deposition rate that can be achieved by system 200. Given that a short step time is desirable, system 200 may be configured such that response time of components associated with gas and precursor delivery be substantially shorter than the step time.

For example, step time should exceed by a factor of 3×–5×, the time required to deliver the gas and/or the precursor from the shutoff valve 221 into chamber 201. Transit time may be estimated as: $t_s = VP/QP_0$ where V is the volume of the delivery line/showerhead downstream of shutoff valve ($CM^3$) 221, Q is the flow rate of the carrier gas (scc/s), P is the operating pressure (Torr) and $P_0$=760 Torr. Short delivery lines, high carrier flows and connective transport to the substrate may shorten transit time. As such, transit time may be reduced to a fraction of second.

During the ALD process, a continuous monolayer of precursor adsorption on the substrate is desirable. For a continuous monolayer coverage precursor concentration in the gas phase must exceed a threshold value to saturate all of the adsorption sites on the substrate. For example, during a Langmuir adsorption processes the fractional coverage increases linearly with precursor partial pressure initially and levels off to 100% once a threshold pressure has been exceeded. Threshold pressure may be determined experimentally from deposition rates and film properties. Additionally, precursor concentration should not greatly exceed the threshold value due to the excess precursor adsorbs on chamber 201 walls and negatively impacting precursor utilization. Chemisorption occurs on time-scales of tens of milliseconds so the shortest pulse time that is controllable and meets the other criteria should be used. For example, longer pulse times tend to waste precursor and increase total duration of a cycle. As such, the total amount of precursor delivered should exceed the quantity adsorbed on the wafer by a factor of 50×–500× to account for precursor consumption (adsorption) on the chamber walls.

Another process consideration includes providing substantially lower water flow compared to TMA flow to oxidize a monolayer of TMA since the TMA is very water sensitive. For example, the total quantity of water delivered should exceed the amount required to convert the TMA adsorbed on the substrate by a factor of 2×–5×. In some embodiments, water tends to adsorb on chamber 201 walls. As such, water flow should be as minimal as possible compared with excess TMA due to excess TMA reacting with residual water on chamber 201 walls. Water flow rate and pulse time should be sufficient to substantially hydroxylate the substrate surface and achieve the maximum deposition rate per cycle, but so that the flow duration has minimal effect on film properties.

During processing, purge flow rates should be sufficiently high to reduce precursor and oxidant concentrations to trace levels after each respective step. For example, if a purge is insufficient, residual precursor concentration in the gas phase will be too high and gas phase reactions that form alumina particles may result when oxidant is introduced. Similarly, care should be taken to ensure that precursor and oxidant never co-flow into chamber 201, into a common delivery line, or into the exhaust to avoid alumina powder formation. As such, system 200 incorporates a liquid delivery system architecture in which the precursor flow is diverted into an exhaust line while an oxidant is flowing (or vice versa) is not possible, since the two would mix in the exhaust line.

System 200 advantageously provide a small relative chamber volume that may be purged more effectively and as such is desirable for ALD applications. Utilizing plasma anneal 208 limits the minimum chamber volume that can be realistically achieved and should be considered.

Figure 3:
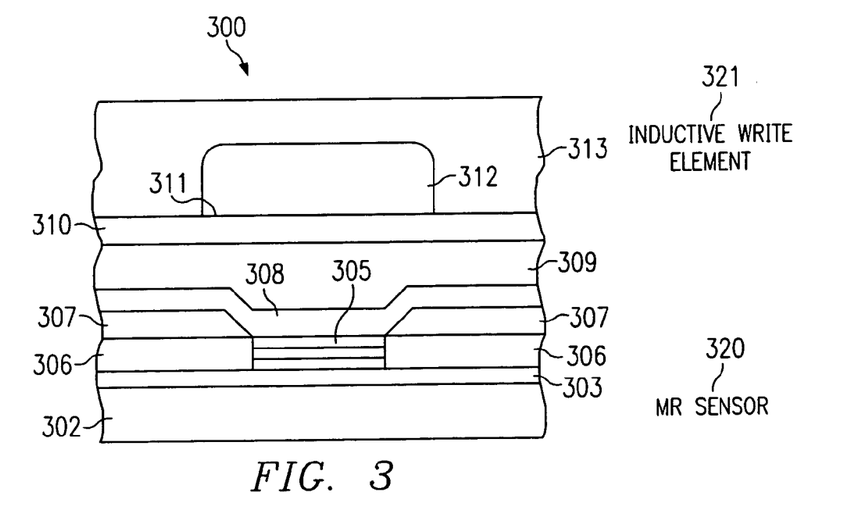
FIG. 3 illustrates a cross section view of a thin film magnetic read/write head incorporating low temperature ALD thin films according to one aspect of the invention.

FIG. 3 illustrates a cross section view of a thin film head incorporating low temperature ALD thin films according to one aspect of the invention.

A magnetic thin film head, illustrated generally at 300, includes a magnetic read sensor 320 and an inductive write element 321 having one or more thin films fabricated using a low-temperature ALD process. A substrate 302 includes a bottom shield 303 coupled to an interlayer 306 of Cr—Co—Pt. Interlayer 306 couples contacts 307 to bottom shield 303. Contacts 307 include Ta—Mo—Au—Cr materials coupled to a top read gap layer 308. Lower polysilicon layer 309 provides a top shield between top read gap layer 308 and top write gap layer 311. An upper polysilicon film 312 is coupled to a thin layer 311 operable as coils, leads and/or studs for inductive write element 321. Upper polysilicon layer 312 may include FeTaN—NiFe—CoFe materials within inductive write element 321. An overcoat 313 protects inductive write element 321.

FIGS. 4–11 illustrate data for process variation of the method illustrated in FIG. 1 using system 200 of FIG. 2. System 200 and the method of FIG. 1 are illustrative of one embodiment for providing low-temperature ALD processes. As such, other systems or methods may be used within the scope and teachings of the present invention.

Figure 4:
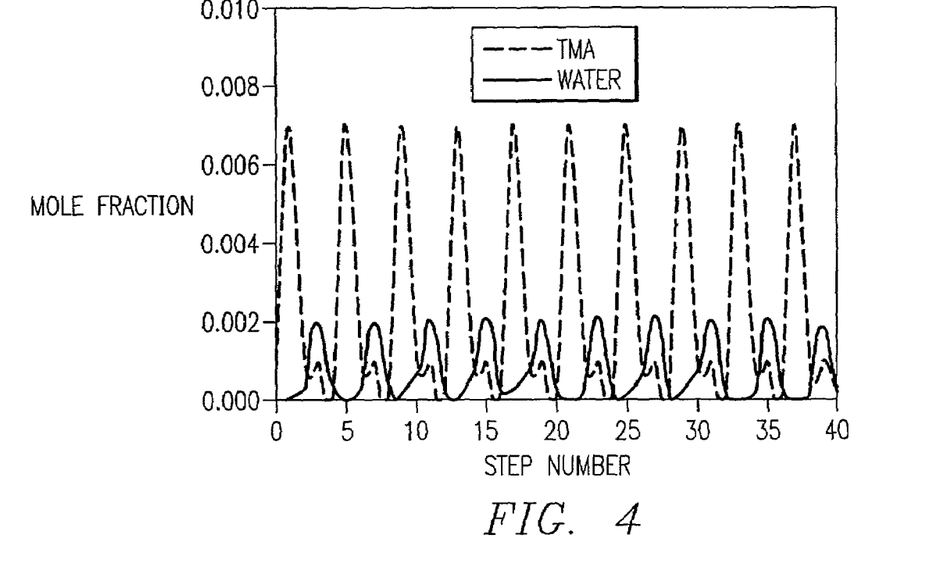
FIG. 4 is a graphic illustration of a simulation for determining mole fractions of a precursor and an oxidant within a process chamber during an ALD process sequence according to one embodiment of the invention.

FIG. 4 is a graphic illustration of a simulation for determining mole fractions of a precursor and an oxidant within a process chamber during an ALD process sequence according to one embodiment of the invention. A gas flow simulation is useful to confirm that precursor, water delivery and purge steps are effective in attaining the desired concentrations at the surface of a substrate. Cycling of precursor and water concentrations in a chamber during various steps (precursor dosing, purge, water dosing, purge) such as the method in FIG. 1 using system 200 of FIG. 2 can be simulated using the formula:

$$X_{n+1} = (X_i - X_n)\exp[-QP_0(t_{n+1}-t_n)/VP] + X_n$$

where $X_{n+1}$ is the mole fraction at time $t_{n+1}$, $X_n$ is the concentration at time $t_n$, $X_i$ is the inlet concentration of the species of interest, Q is the total flow rate (scc/s), P is the chamber pressure (Torr), V is the chamber volume ($cm^3$) and $P_0$=760 Torr. For the process conditions described above, variation of TMA and water mole fractions at the end of precursor dosing, first purge, water dosing, and second purge steps are shown in FIG. 4. Note that the same steady state concentrations of precursor and water are achieved during each cycle because the purge steps are effective in reducing the residual concentrations to near zero levels.

Figure 5:
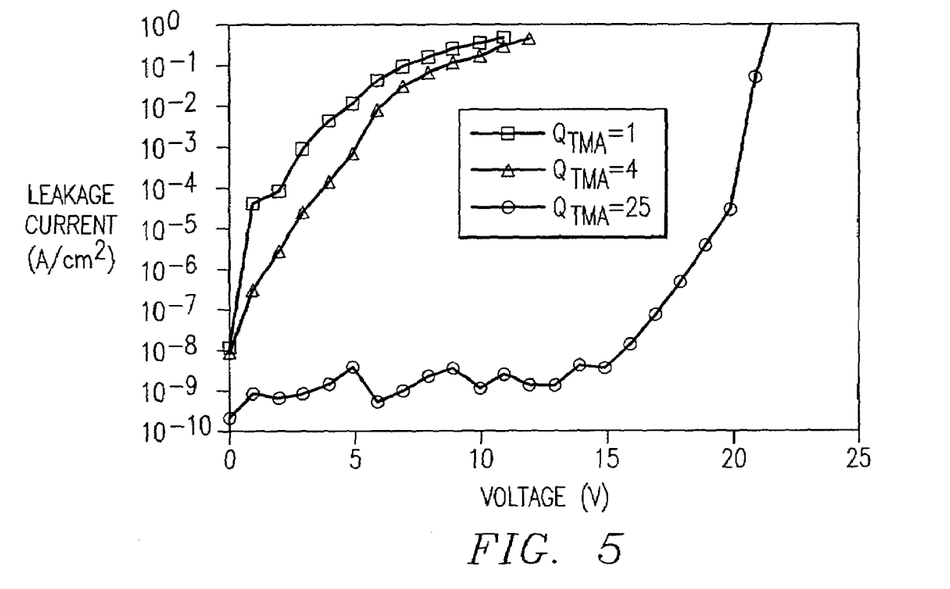
FIG. 5 is a graphic illustration of an I-V curve as a function of inlet precursor flow at a deposition temperature of 350° C. for approximately 200 Å ALD AlO$_x$ according to one embodiment of the invention.

FIG. 5 is a graphic illustration of an I-V curve as a function of inlet precursor flow at a deposition temperature of 350° C. for approximately 200 Å ALD $AlO_x$ according to one embodiment of the invention. Breakdown field strength is a good measure of film quality since impurities, defects, roughness and lack of film continuity compromise breakdown strength. FIG. 5 illustrates breakdown field strengths for films deposited on 200 mm bare p-type Si substrates with a resistivity of 1–10 Ω.cm. In some cases, the substrates were subjected to a 20 s sputter etch to remove ~20 Å of native oxide. However, breakdown fields with and without a sputter etch were similar, indicating that the native oxide and any increase in surface roughness due to sputter etching has minimal impact on the breakdown strength. As such, breakdown strengths are also measured on bare Si substrates without ALD $AlO_x$.

Figure 6:
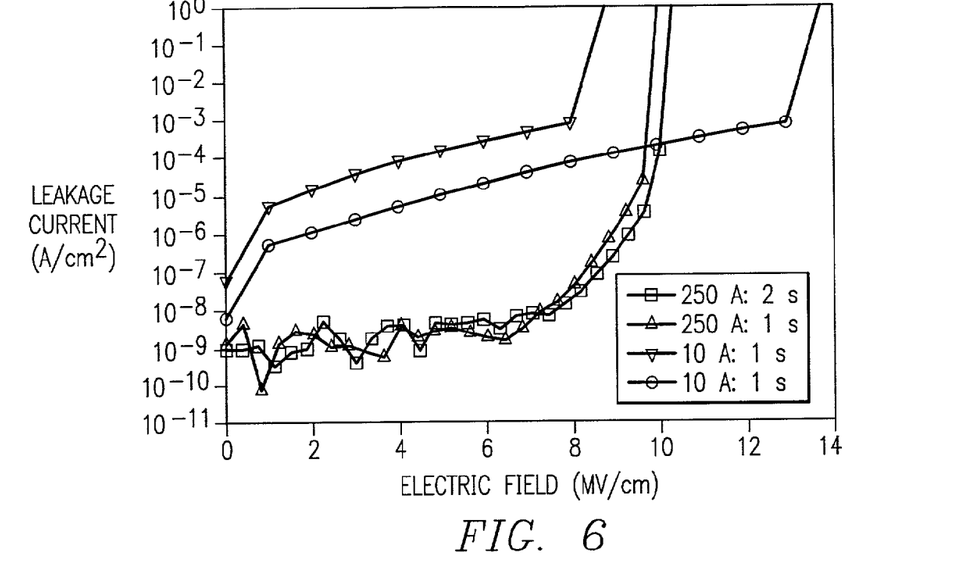
FIG. 6 is a graphic illustration of an I-E curve as a function of TMA precursor flow time at a deposition temperature of 200° C. for approximately 250 Å ALD AlO$_x$ and 10 Å ALD AlO$_x$ according to one aspect of the invention.

Breakdown field increases monotonically from zero as the precursor flow rate ($Q_{TMA}$) into the chamber increases. At the lowest precursor flow rate the breakdown field strength is ~3 MV/cm (@ 0.01 A/cm$^2$). The I-V curves of FIG. 6 illustrate that the breakdown strength increases to 9 MV/cm at a precursor flow rate that is 25 times higher. FIG. 6 is a graphic illustration of an I-E curve as a function of TMA precursor flow time at a deposition temperature of 200° C. for approximately 250 Å ALD AlO$_x$ and 10 Å ALD AlO$_x$ according to one aspect of the invention. As the inlet concentration of precursor is above a threshold value, increasing the precursor flow duration from one second to two seconds does not affect the breakdown strength or the deposition rate significantly. For example, the deposition rate increases from 0.83 Å/cycle to 0.89 Å/cycle while the breakdown field strength increases slightly. Once a sufficient precursor dose has been achieved, the growth rate should not change.

Additionally, flow duration of 1 s may be too short compared to the transit time of the precursor from the delivery valve to the substrate. For example, I-V curves illustrated in FIG. 6 include ultra-thin films (10A) deposited with one second and two second long precursor flow pulses. The longer flow time ensures that film growth is continuous from the very first layer. For example, when the TMA flow duration was reduced from two seconds to one second, the breakdown strength of the films decreased from 10 MV/cm to 6 MV/cm. Further, the order of steps of the process (i.e. whether TMA is introduced first or the water is introduced first) does not affect the breakdown strength of the resulting ALD layer.

Figure 7:
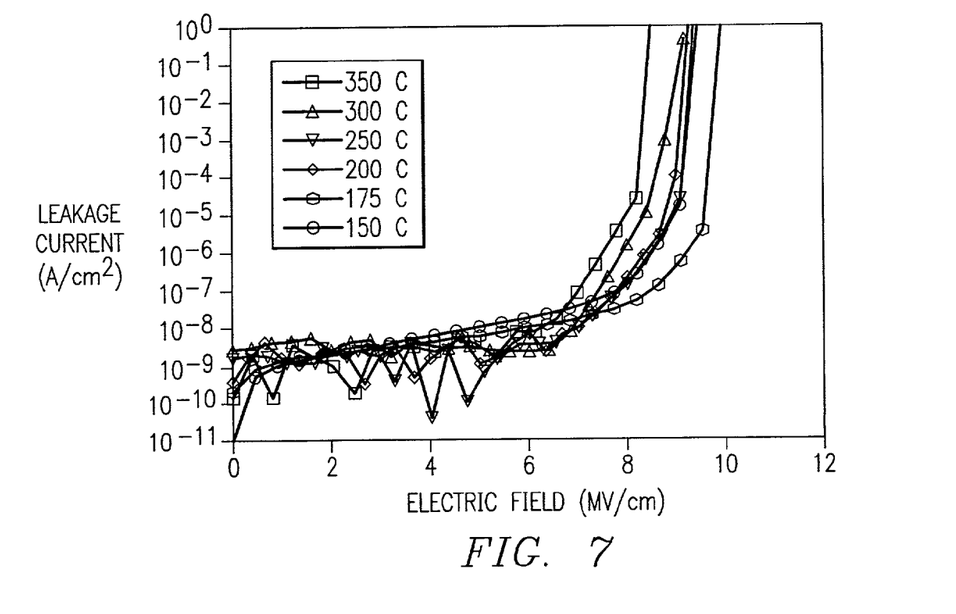
FIG. 7 is a graphic illustration of an I-E curve as a function of deposition temperature for approximately 275 Å ALD AlO$_x$ according to one aspect of the invention.

FIG. 7 is a graphic illustration of an I-E curve as a function of deposition temperature for approximately 275 Å ALD AlO$_x$ according to one aspect of the invention. The I-E curves illustrated in FIG. 5 show that the breakdown field is relatively invariant with deposition temperature in the range of 150–350° C. indicating the temperature window for a low temperature ALD process is relatively wide. An increase in deposition temperature accompanied by a gradual decrease in deposition rate from ~0.85 Å/cycle at 200° C. to 0.6 Å/cycle at 350° C., resulting in a slight decrease in breakdown field strength. The low electric field characteristics are similar over this temperature range and optimal breakdown properties may be obtained in the temperature range of 175° C.–200° C.

Figure 8A:
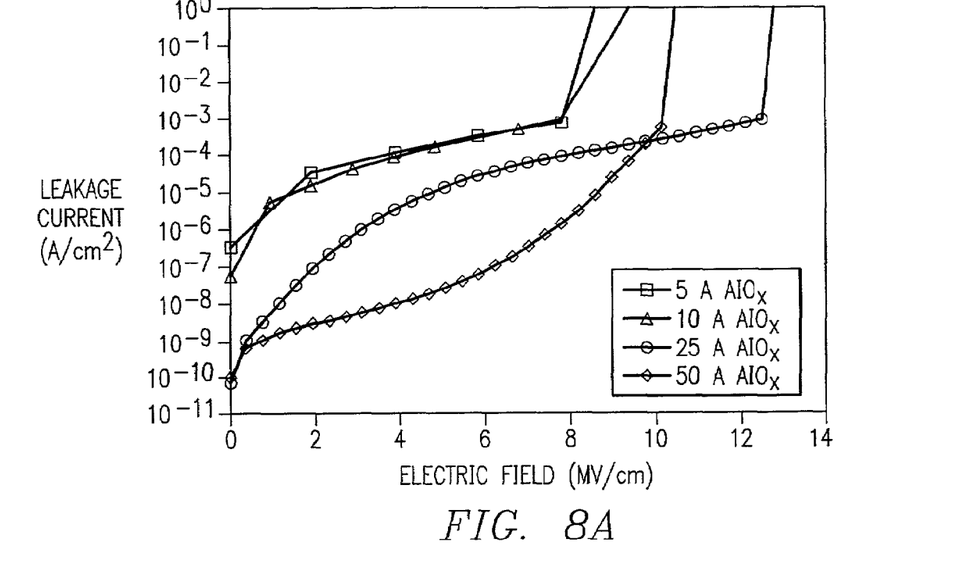
FIG. 8A is a graphic illustration of one embodiment of an I-E curve as a function of ALD AlO$_x$ thickness for films deposited at 200° C. on a silicon substrate according to one aspect of the invention.
Figure 8B:
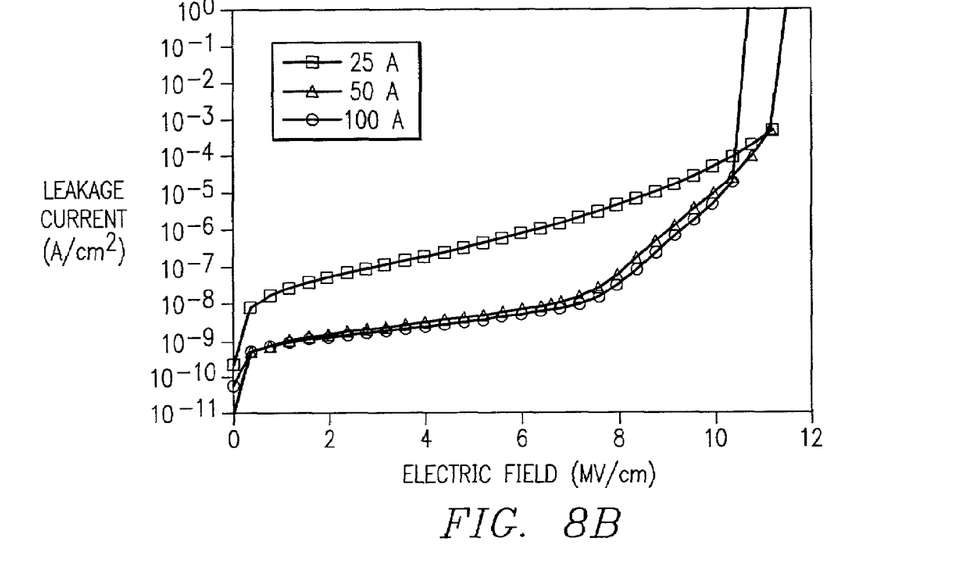
FIG. 8B is a graphic illustration of one embodiment of an I-E curve as function of ALD AlO$_x$ thickness for films deposited at 200° C. on a silicon substrate having a 50 Å layer of tantalum according to one aspect of the invention.

FIGS. 8A and 8B illustrate I-E curves as a function of ALD AlO$_x$ film thickness. The dependence of breakdown voltage on film thickness shows a linear trend for films as thin as 5 and 10 Å indicating that a continuous layer-by-layer growth may be achieved using low temperature ALD processes. Additionally, native oxide if present does not affect the breakdown strength. FIGS. 8A and 8B illustrate that leakage current remains low until failure occurs with a sharp increase in leakage current. As such, the low temperature ALD process results in excellent insulating characteristics of ALD AlO$_x$ even at 5 and 10 Å make it a candidate for tunnel barrier applications. FIGS. 8A and 8B also show that the breakdown field strength gradually increases as the thickness increases from 5 Å to 25 Å, but then declines slightly for thicker films. This behavior is consistent with observations for thermal SiO$_2$. Also leakage currents at lower fields are higher for the thinner films due to the contribution of tunneling currents. Breakdown fields are similar on both Si and Ta confirming that the native oxide has minimal effect on the breakdown strength of the ALD film.

Figure 9:
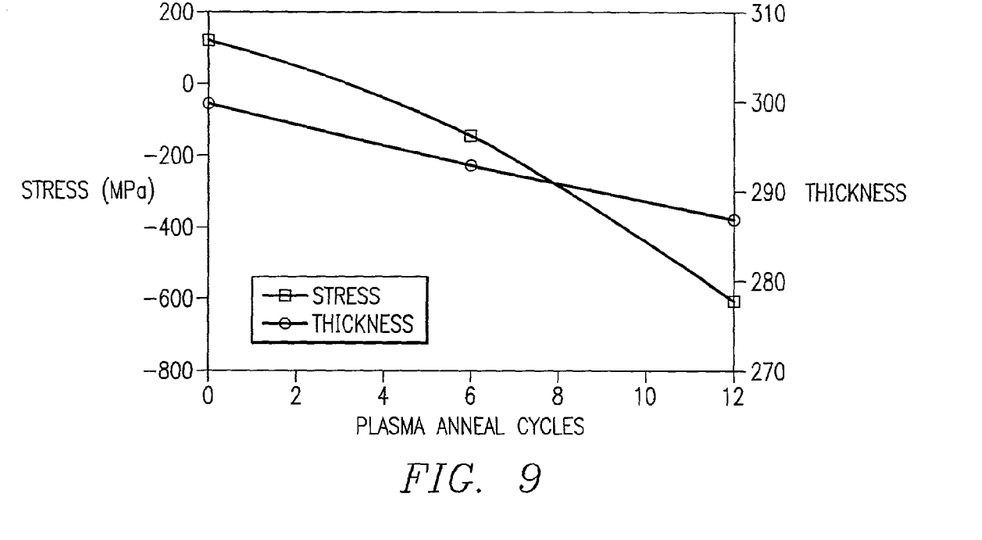
FIG. 9 is a graphic illustration of film stress as a function of plasma annealing for approximately 300 Å ALD AlO$_x$ according to one aspect of the invention.
Figure 10:
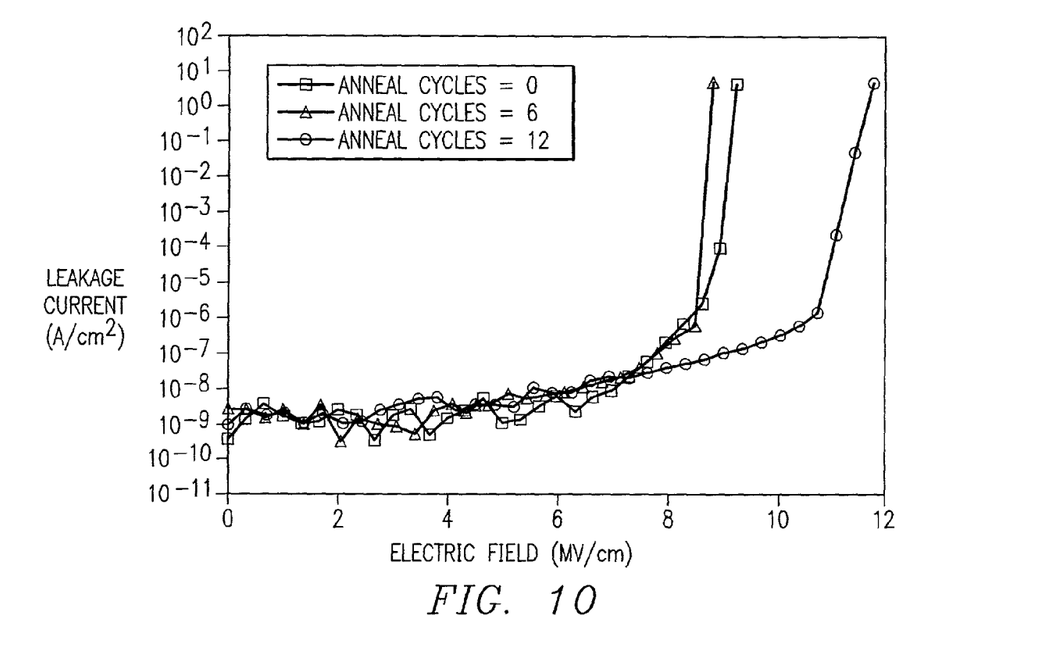
FIG. 10 is a graphic illustration of I-E curves as a function of plasma annealing for approximately 300 Å ALD AlO$_x$ according to one aspect of the invention.

FIG. 9 is a graphic illustration of film stress as a function of plasma annealing for approximately 300 Å ALD AlO$_x$ according to one aspect of the invention. Most ALD AlO$_x$ films have a low tensile stress as-deposited, ranging from 150 MPa at 200° C. to over 500 MPa at 150° C. In general, low compressive stress is favored for dielectric films. In order to make the stress compressive, the lower temperature ALD process may include an in-situ plasma anneal every 25–50 Å of growth. Plasma annealing makes the film compressive and a low (<200 MPa) compressive can be obtained. As illustrated in FIG. 9, the film thickness is not significantly affected indicating the absence of deposition and any significant etching during the annealing step. FIG. 10 is a graphic illustration of I-E curves as a function of plasma annealing for approximately 300 Å ALD AlO$_x$ according to one aspect of the invention. Plasma annealing increases the breakdown strength of the ALD AlO$_x$ thin film.

There is a correlation between ALD AlO$_x$ roughness and the breakdown field strengths. For films deposited at 200° C. with an adequate flow of precursor (normalized flow=25), the breakdown field strength is ~10 MV/cm and the films are very smooth with R$_a$~2 Å. In comparison, films deposited at lower precursor flows (relative flow=4) have a lower breakdown strength of ~6 MV/cm and are substantially more rough with R$_a$~5 Å. Low roughness of the films illustrates the growth is monolayer by monolayer rather than island type growth that is typical of most CVD processes. For island type growth, the film roughness increases with film thickness while it is relatively invariant with thickness for the ALD growth mode. Another measure of film continuity is pinhole density. To measure the pinhole density, 100–200 Å films were deposited on NiFe and subjected to an acid dip to decorate the pinholes. No pinholes were observed in a 10× field of view in an optical microscope. The wet etch-rate in photo-resist developer is similar to that for ion beam deposited alumina confirming the chemical stability of this material.

Figure 11A:
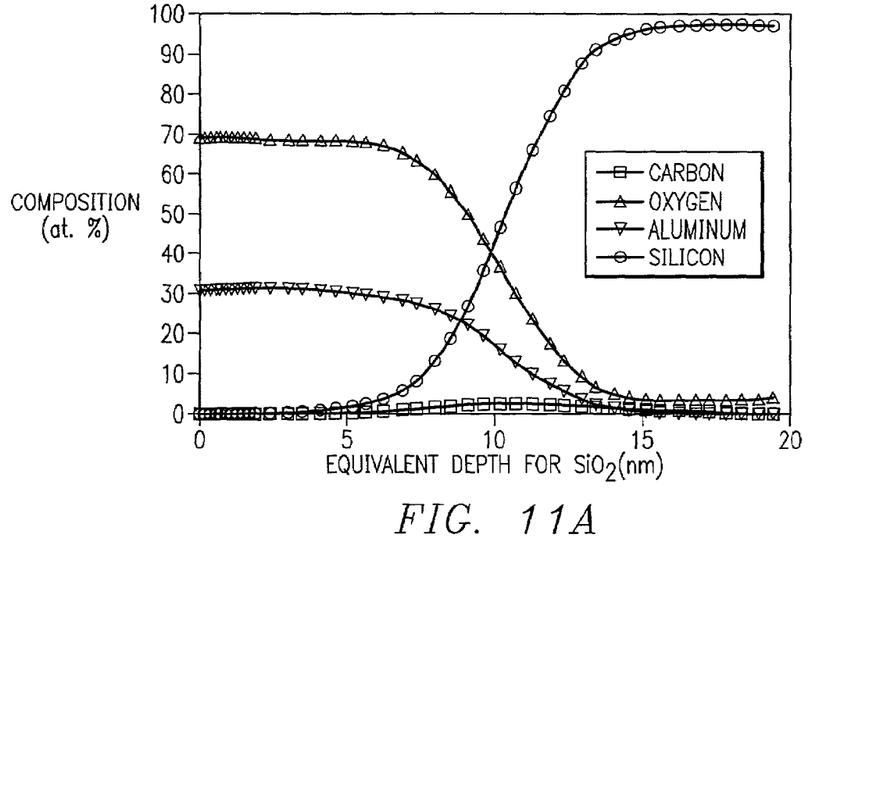
FIG. 11A is a graphic illustration of ALD AlO$_x$ deposited at 350° C. on a silicon substrate with a normalized precursor flow of 4 sccm according to one aspect of the invention.
Figure 11B:
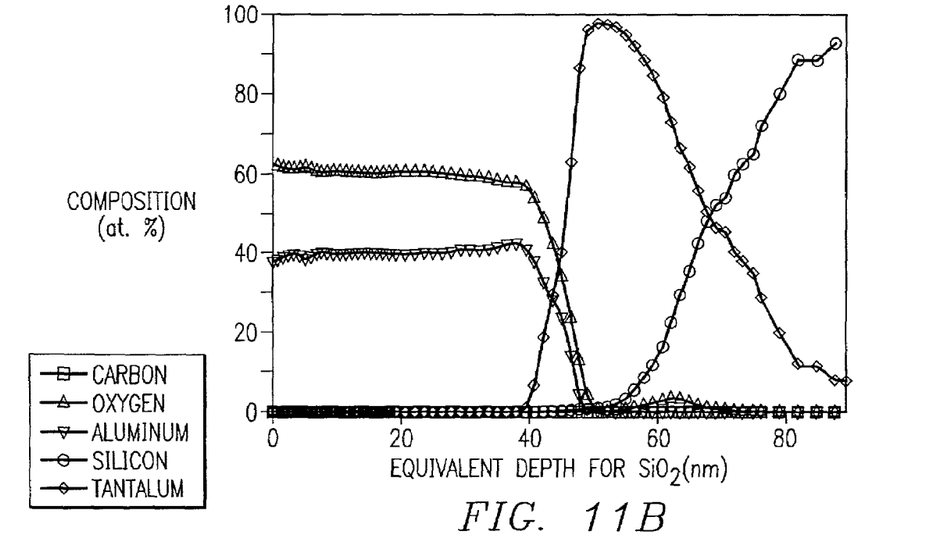
FIG. 11B is a graphic illustration of ALD AlO$_x$ deposited at 200° C. on tantalum with a normalized precursor flow of 25 sccm according to one aspect of the invention.

FIG. 11A is a graphic illustration of ALD AlO$_x$ deposited at 350° C. on a silicon substrate with a normalized precursor flow of 4 sccm according to one aspect of the invention. The CH$_3$ groups are removed entirely from the ALD AlO$_x$ by using H$_2$O as the oxidant since the [C] content in the films is at the detectable limits of Auger analysis. The films are stoichiometric within the resolution of Auger analysis as illustrated in FIGS. 11A and 11B even at deposition temperatures as low as 200° C. Additionally, [H] content is ~5%. The changing [H] content may cause the refractive index to increase from 1.64 to 1.68 as the deposition temperature increases from 250° C. to 400° C.

One primary advantage of low-temperature ALD AlO$_x$ is step coverage that may be achieved. Substantially conformal deposition (100% step coverage) can be obtained even in very aggressive structures having small geometries. Unlike PVD films, the dielectric properties are expected to be similar in the field and the sidewall. For PVD films, dielectric properties are usually worse on the sidewall in addition to poor step coverage because of self-shadowing effects.

Deposition rate is weakly dependent on temperature, which translates to very good deposition uniformities compared to most CVD processes. A deposition uniformity and repeatability of ~1% can easily be achieved. Properties of ALD AlO$_x$ deposited at 200° C. under optimal process conditions may include a thin film thickness between 100–300 Å, a deposition rate of ~0.85 Å/cycle, a refractive index of 1.64–1.65, compressive stress of less than 200 MPa, roughness (200 Å) of less than 2 Å, stoichiometric composition, impurities of less than 1%, amorphous morphology, a density (g/cm$^3$) of 3.65 (92% of bulk), a breakdown field of >10 MV/cm, and leakage current (A/cm$^2$) of <10$^{-8}$ @ 1 MV/cm.

In one embodiment, the following parameters deposit a desirable film:

| Parameter | Heat | Water | Purge | TMA | Purge | Post |
|---|---|---|---|---|---|---|
| Step | 1 | 2 | 3 | 4 | 5 | 6 |
| TMA (sccm) | | | | 25 | | |
| Octane (sccm) | | | | 300 | | |
| Water (sccm) | | 0.54 | | | | |
| Ar carrier 2 (sccm) | | 63 | | | | |
| Bubbler (psig) | 35 | 35 | 35 | 35 | 35 | 35 |
| Diluent Ar 2 (sccm) | 200 | 200 | 200 | 200 | 200 | 200 |
| Ar Carrier/Purge 1 (slm) | 0.05 | 0.05 | 0.05 | 0.05 | 2 | |
| Ar Purge 2 (slm) | | | 2 | | | |
| Ar Bottom (slm) | 2 | 2 | 2 | 2 | 2 | |
| Pressure (Torr) | 3 | 3 | 3 | 3 | 3 | |
| Chuck Z1 (° C.) | 214 | 214 | 214 | 214 | 214 | 214 |
| Chuck Z2 (° C.) | 263 | 263 | 263 | 263 | 263 | 263 |
| Wafer (° C.) | 200 | 200 | 200 | 200 | 200 | 200 |
| Time | 180 | 2 | 9 | 2 | 5 | |

Steps 2–5 represent a single ALD cycle and are repeated multiple times to deposit a film of desired thickness, with a film of approximately 0.85 Angstroms deposited each cycle. At every 25 to 50 Angstroms of thickness, an in-situ plasma anneal is performed. Step 6 represents a sequence of three pump and purge cycles performed upon completion of the film. These parameters provide a high quality film, however, modifications to these parameters, including the frequency of plasma anneals, are possible to achieve a desired breakdown strength and film stress.

Although the disclosed embodiments have been described in detail, it should be understood that various changes, substitutions and alterations can be made to the embodiments without departing from their spirit and scope.

What is claimed is:

1. A method of fabricating a conformal film on a substrate, the method comprising:
   heating the substrate to a temperature sufficiently low so that precursor adsorbed on the substrate is not thermally dissociated;
   depositing a film of predetermined thickness on the substrate by performing a predetermined number of atomic layer deposition cycles in a processing chamber, each atomic layer deposition cycle comprising:
   dosing the substrate with a precursor to establish a monolayer of the precursor on the substrate; and
   dosing the substrate with a reactant to deposit an atomic layer deposition film;
   wherein the film, as deposited, generally has a tensile intrinsic stress; and
   annealing the substrate and the film after a predetermined number of atomic layer deposition cycles to change the intrinsic stress in the film from tensile to compressive.

2. The method of claim 1 wherein annealing further comprises plasma annealing the substrate.

3. The method of claim 1 further comprising varying the frequency of the annealing to vary the intrinsic stress of the film between tensile and compressive.

4. The method of claim 1 wherein annealing the substrate further comprises performing plural plasma anneals, wherein the frequency of the anneals is determined to achieve a desired breakdown field strength.

5. The method of claim 1 wherein the annealing further comprises plasma annealing in a reactive ambient.

6. The method of claim 1 wherein annealing further comprises plasma annealing the substrate in a reactive ambient every 25 to 50 Å of the film deposited.

7. The method of claim 1 wherein the precursor comprises trimethylaluminum and the substrate is heated to a temperature within the range of between 60 degrees Celsius and 350 degrees Celsius.

8. The method of claim 7 wherein the substrate temperature is approximately 150 to 200 degrees Celsius.

9. The method of claim 1 wherein an atomic layer deposition cycle deposits a film having a thickness of approximately 0.8 Å.

10. The method of claim 1 wherein the precursor comprises trimethylaluminum, the reactant comprises water and annealing further comprises annealing in a reactive ambient comprising oxygen.

11. The method of claim 1 wherein the annealing comprises a rapid thermal anneal.

12. The method of claim 1 wherein the annealing comprises an in-situ plasma anneal.

13. The method of claim 12 wherein the plasma anneal comprises heating the substrate with an RF source in an $Ar/O_2$ ambient.

14. The method of claim 1 further comprising maintaining a 50/500 dose to adsorption ratio.

15. The method of claim 1 wherein:
   dosing the substrate with a precursor further comprises flowing the precursor from a first zone of a multi-zone shower head; and
   dosing the substrate with a reactant further comprises flowing the reactant from a second zone of the multi-zone showerhead.

16. A method for fabricating a thin $AlO_x$ film on a substrate with a precursor and atomic layer deposition, the method comprising:
   heating the substrate to a temperature so that precursor adsorbed on the substrate is not thermally dissociated;
   performing plural atomic layer deposition cycles to form an $AlO_x$ film, each cycle comprising deposition of $AlO_x$ by reacting a monolayer of precursor on the substrate with a reactant;
   wherein the $AlO_x$ film, as deposited, generally has a tensile intrinsic stress; and
   annealing the $AlO_x$ film in a reactive ambient at one or more predetermined film thickness to change the intrinsic stress in the film from tensile to compressive.

17. The method of claim 16 wherein the precursor comprises trimethylaluminum.

18. The method of claim 17 wherein the substrate temperature comprises approximately 200 degrees Celsius or less.

19. The method of claim 17 wherein the reactant comprises water.

20. The method of claim 19 wherein the precursor flows from a first zone of a multi-zone showerhead and the reactant flows from a second zone of the multi-zone showerhead.

21. The method of claim 17 wherein annealing further comprises annealing the $AlO_x$ film approximately every 25 to 50 Å of thickness.

22. The method of claim 17 wherein annealing comprises in-situ plasma annealing in a reactive ambient.

23. The method of claim 22 wherein the reactive ambient comprises $Ar/O_2$ that oxidizes impurities associated with the $AlO_x$ film.

24. The method of claim 22 wherein the film comprises a gap layer for a thin film head.

25. The method of claim 22 wherein the film comprises a tunnel barrier in a magnetic tunnel junction.

26. The method of claim 16 further comprising varying the frequency of the annealing to vary the intrinsic stress of the film between tensile and compressive.

27. The method of claim 1 wherein annealing the substrate and the film comprises one or more anneals that provide the deposited film with a breakdown voltage of at least 9 MV/cm.

28. The method of claim 27 wherein annealing the substrate and film comprises one or more plasma anneals, which plasma anneals provide the deposited film with a breakdown voltage of at least 10 MV/cm.

29. The method of claim 16 wherein annealing the $AlO_x$ film comprises one or more anneals that provide the deposited film with a breakdown voltage of at least 9 MV/cm.

30. The method of claim 29 wherein annealing the $AlO_x$ film comprises performing one or more plasma anneals, which one or more plasma anneals provide the deposited $AlO_x$ film with a breakdown voltage of at least 10 MV/cm.

* * * * *